US007734984B2

(12) United States Patent
Nee et al.

(10) Patent No.: US 7,734,984 B2
(45) Date of Patent: Jun. 8, 2010

(54) ERASURES ASSISTED BLOCK CODE DECODER AND RELATED METHOD

(75) Inventors: Chi-Ping Nee, Santee, CA (US); Abraham Krieger, San Diego, CA (US); Shachar Kons, Haifa (IL); Chun-Hsuan Kuo, San Diego, CA (US)

(73) Assignee: Trident Microsystems (Far East) Ltd., Grand Cayman (KY)

( * ) Notice: Subject to any disclaimer, the term of this patent is extended or adjusted under 35 U.S.C. 154(b) by 880 days.

(21) Appl. No.: 11/595,546

(22) Filed: Nov. 10, 2006

(65) Prior Publication Data

US 2007/0245208 A1 Oct. 18, 2007

Related U.S. Application Data

(60) Provisional application No. 60/792,129, filed on Apr. 13, 2006.

(51) Int. Cl.
*H03M 13/00* (2006.01)
(52) U.S. Cl. .......................... 714/755; 714/784
(58) Field of Classification Search ................. 714/755, 714/784
See application file for complete search history.

(56) References Cited

U.S. PATENT DOCUMENTS

| 4,907,233 A | | 3/1990 | Deutsch |
| 5,206,864 A | | 4/1993 | McConnell |
| 5,220,568 A | * | 6/1993 | Howe et al. ............... 714/782 |
| 5,942,003 A | * | 8/1999 | Ivry ....................... 714/762 |
| 6,034,996 A | | 3/2000 | Herzberg |
| 6,081,919 A | * | 6/2000 | Fujiwara et al. ........... 714/755 |
| 6,697,985 B1 | * | 2/2004 | Ilani ...................... 714/751 |
| 6,721,373 B1 | * | 4/2004 | Frenkel et al. ............ 375/346 |

(Continued)

FOREIGN PATENT DOCUMENTS

| EP | 0 828 248 A | 3/1998 |
| WO | WO 2004/049579 A | 6/2004 |

OTHER PUBLICATIONS

M. K. Cheng et al.; "Soft-Decision Reed-Solomon Decoding on Partial Response Channels," Department of Electrical and Computer Engineering, University of California, San Diego, CA, 2002 IEEE; pp. 1026-1030.

(Continued)

*Primary Examiner*—Esaw T Abraham
(74) *Attorney, Agent, or Firm*—DLA Piper LLP (US)

(57) ABSTRACT

An erasures assisted block code decoder and related method are provided. The erasures assisted block code decoder includes a first block decoder, an erasures processor, and a second block code decoder. The first block decoder, for example, a Reed-Solomon decoder, is configured to decode blocks of data elements, e.g., bytes, that were previously affected by bursty errors. The first block decoder is also configured to identify those of such blocks it is unable to decode. The erasures processor is configured to identify, as erasures, data elements in the un-decodable blocks by utilizing, in the erasures identification process, data elements in the decoded blocks that were corrected by the first block decoder. The second block decoder, e.g., the same or different Reed-Solomon decoder, is configured to decode one or more of the un-decodable blocks by utilizing, in the decoding, the erasures identified by the erasures processor.

6 Claims, 4 Drawing Sheets

U.S. PATENT DOCUMENTS

| | | | | |
|---|---|---|---|---|
| 7,050,419 B2 * | 5/2006 | Azenkot et al. | ............. | 370/347 |
| 7,093,188 B2 * | 8/2006 | Maiuzzo et al. | ............. | 714/795 |
| 7,237,173 B2 * | 6/2007 | Morita et al. | ............... | 714/755 |
| 7,370,258 B2 * | 5/2008 | Iancu et al. | ................. | 714/755 |
| 7,549,106 B2 * | 6/2009 | Maiuzzo | ..................... | 714/755 |
| 7,577,893 B2 * | 8/2009 | Song et al. | .................. | 714/755 |

OTHER PUBLICATIONS

J. Jiang et al.; "Iterative Soft-Input-Output Decoding of Reed-Solomon Codes by Adapting the Parity-Check Matrix," IEEE Transactions on Information Theory, vol. 52, No. 8, Aug. 2006, pp. 3746-3756.

International Search Report; PCT/US2007/009177, mailed Feb. 5, 2008.

Baum C W et al: "Erasure Generation and Interleaving for Meteor-Burst Communications with Fixed-Rate and Variable-Rate Coding", Proceedings of the Military Communications Conference (MILCOM), San Diego, Nov. 6-8, 1995.

Jing Jiang et al: "Iterative Soft Decision Decoding of Reed Solomon Codes Based on Adaptive Parity Check Matrices", Information Theory, 2004. ISIT 2004. Proceedings, International Symposium on Chicago, Illinois, USA, Jun. 27-Jul. 2, 2004.

* cited by examiner

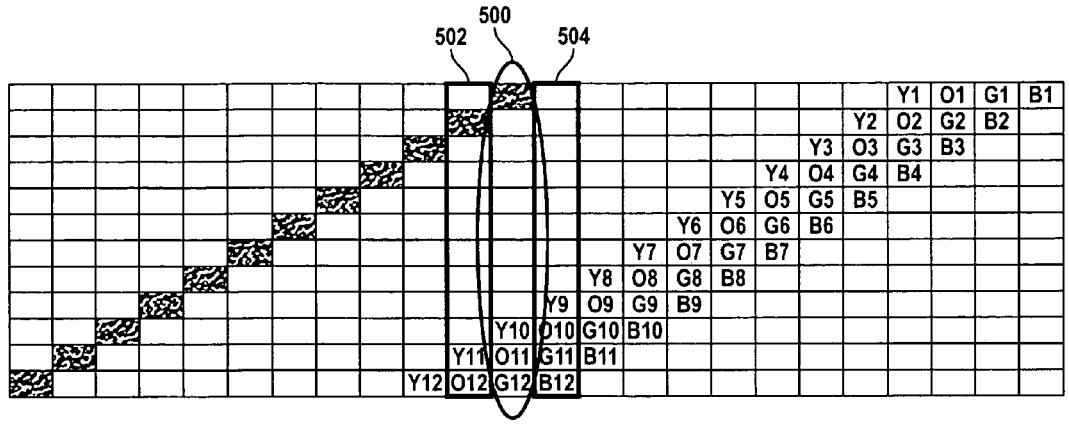
FIG. 5
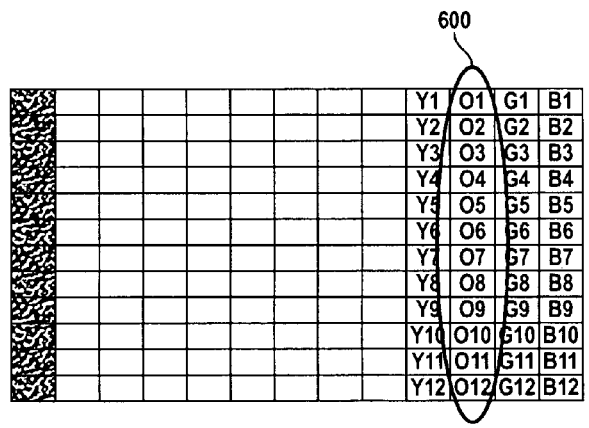
FIG. 6
| O1 | 0 | 12 | 24 | 36 | 48 | 60 | 72 | 84 | 96 | 108 | 120 | 132 | 144 | 156 | 168 | 180 | 192 |
|---|---|---|---|---|---|---|---|---|---|---|---|---|---|---|---|---|---|
| O2 | 1 | 13 | 25 | 37 | 49 | 61 | 73 | 85 | 97 | 109 | 121 | 133 | 145 | 157 | 169 | 181 | 193 |
| O3 | 2 | 14 | 26 | 38 | 50 | 62 | 74 | 86 | 98 | 110 | 122 | 134 | 146 | 158 | 170 | 182 | 194 |
| O4 | 3 | 15 | 27 | 39 | 51 | 63 | 75 | 87 | 99 | 112 | 123 | 135 | 147 | 159 | 171 | 183 | 195 |
| O5 | 4 | 16 | 28 | 40 | 52 | 64 | 76 | 88 | 100 | 112 | 124 | 136 | 148 | 160 | 172 | 184 | 196 |
| O6 | 5 | 17 | 29 | 41 | 53 | 65 | 77 | 89 | 101 | 113 | 125 | 137 | 149 | 161 | 173 | 185 | 197 |
| O7 | 6 | 18 | 30 | 42 | 54 | 66 | 78 | 90 | 102 | 114 | 126 | 138 | 150 | 162 | 174 | 186 | 198 |
| O8 | 7 | 19 | 31 | 43 | 55 | 67 | 79 | 91 | 103 | 115 | 127 | 139 | 151 | 163 | 175 | 187 | 199 |
| O9 | 8 | 20 | 32 | 44 | 56 | 68 | 80 | 92 | 104 | 116 | 128 | 140 | 152 | 164 | 176 | 188 | 200 |
| O10 | C | Ced | C | C | C | C | C | C | C | C | C | C | Ced | C | C | C |
| O11 | F | F | F | F | F | F | F | F | F | F | F | F | F | F | F | F |
| O12 | C | Ced | C | C | C | C | C | C | Ced | C | Ced | C | C | C | C |
702       704   706 708
FIG. 7

ERASURES ASSISTED BLOCK CODE DECODER AND RELATED METHOD

BACKGROUND OF THE INVENTION

This application claims the benefit of U.S. Provisional Patent Application No. 60/792,129, filed Apr. 13, 2006, which is hereby fully incorporated by reference herein as though set forth in full.

FIELD OF THE INVENTION

This application relates generally to block code decoders, and, more specifically, to increasing the number of correctable errors in such decoders.

RELATED ART

A forward error correction code is a code applied to encode source information at the transmitter so that errors introduced by transmission over the communications channel can be corrected through corresponding decoding performed at the receiver. To increase the error detection and correction capability of the code, it is common to apply combinations of codes, a process which is often referred to as code concatenation. In one example of code concatenation, an outer code is first applied to encode the source information, and then an inner code is applied to further encode the information. The inner and outer codes can be selected to address different classes of errors or complement one another in other ways.

FIG. 1 illustrates an example of a FEC encoder 100 that applies a concatenated code, comprising an outer code and an inner code. In this example, the outer code is a block code, and the inner code is a convolutional code. The encoder 100 typically forms a portion of a transmitter configured to communicate information over a communications channel to a receiver. The encoder 100 comprises a block code encoder 102, an interleaver 104, and a convolutional code encoder 106. The input to block code encoder 102 consists of blocks of data. The encoder 102 appends parity information to each block, which is to be used at the receiver for error detection and correction. The interleaver 104 is configured to permute the encoded blocks in order to reduce the impact of the (anticipated) bursty errors introduced by the communication channel. In one configuration, the interleaver 104 is a convolutional interleaver that is configured to interleave the encoded blocks from encoder 102 at the byte level. The convolutional encoder 106 is configured to convolutionally encode the permuted blocks output by the interleaver 104. Typically, this encoding is performed at the bit level and introduces a certain amount of redundancy that is used for error detection and correction. For example, the encoder 106 may be a rate ½ convolutional encoder that substitutes two convolutionally encoded bits for every input but, and thus doubles the size of the encoded blocks, although, with puncturing, the degree of redundancy that is introduced can be reduced.

FIG. 2 illustrates a decoder 300 for decoding the encoded data produced by the encoder 100 after transmission over the communication channel. The decoder 200 typically forms a portion of a receiver. The decoder 200 comprises an inner decoder 202, a de-interleaver 206, and a block code decoder 208. The inner decoder 202, typically a Viterbi decoder, is configured to decode the convolutional encoding applied by the (inner) convolutional encoder 106 in FIG. 1. The output 204 of the inner decoder 202 is input to the de-interleaver 206, which is configured to reverse the permutations introduced by the interleaver 104. Through this process, the de-interleaver 206 spreads any bursty errors introduced by communication over the communications channel. The data from de-interleaver 206 is input to the block code decoder 208, which is configured to decode the block code encoding applied by the block code encoder 102 of FIG. 1. Therefore, in the case where the block code encoder 102 is a Reed-Solomon encoder, the block code decoder 208 is likewise chosen to be a Reed-Solomon decoder.

The error detection and correction capability of the decoder 200 is typically defined by the amount of parity information appended by the block code encoder 102. In the case where the encoder 102 is a (n, k) Reed-Solomon encoder over GF(256), indicating that the encoder appends n-k bytes of parity information to each k byte block, and the block code decoder 208 is a (n, k) Reed-Solomon decoder, the decoder 200 is able to detect and correct $\lfloor d_{min}/2 \rfloor$ errors, where "$\lfloor$" represents the "floor" operator, and $d_{min}=(n-k+1)$. Thus, for a code where $d_{min}=17$, the decoder is able to detect and correct up to 8 errors.

To increase the error detection and correction capability of the decoder 200, various schemes have been proposed, none of which is entirety satisfactory. One approach calls for configuring the inner decoder 202 such that its output 204 is in the form of soft bit estimates rather than hard bit estimates, and also configuring the block code decoder 208, which is typically configured to handle only hard bit estimates, so that it is capable of handling soft bit estimates. See, e.g., M. K. Cheng et al., "Soft-Decision Reed-Solomon Decoding on Partial Response Channels," GLOBECOM'02—IEEE Global Telecommunications Conference. Conference Record, vol. 2, 2002, pages 1026-30; J. Jiang et al., Iterative Soft-Input Soft-Output Decoding of Reed-Solomon Codes By Adapting the Parity Check Matrix, IEEE Transactions on Information Theory, Vol. 52, No. 8, August 2006, pages 3746-3756. However, while this approach is theoretically able to increase the error detection and correction capability of the decoder 200, it has proven difficult or impossible to implement in practice.

SUMMARY

The invention provides an erasures assisted block code decoder and related method. The decoder comprises a first block decoder, an erasures processor, and a second block decoder. The first block decoder, for example, a Reed-Solomon decoder, is configured to decode blocks of data elements, e.g., bytes. The first block decoder is also configured to identify those of such blocks it is unable to decode. An erasures processor is configured to identify, as erasures, data elements in the un-decodable blocks that are likely erroneous utilizing, in the erasures identification process, data elements in the decoded blocks that were corrected by the first block decoder. The second block decoder, which may be the same or a different decoder than the first block decoder, is configured to decode one or more of the un-decodable blocks by utilizing, in the decoding, the erasures identified by the erasures processor.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The invention can be better understood with reference to the following figures. The components in the figures are not necessarily to scale, emphasis instead being placed upon illustrating the principles of the invention. Moreover, in the figures, like reference numerals designate corresponding parts throughout the different views.

FIG. 5 illustrates an example of blocks of data output by the first Reed-Solomon decoder of FIG. 4.

FIG. 6 illustrates the blocks of data of FIG. 5 after passage through the interleaver of FIG. 4.

FIG. 7 is a more detailed rendering of the data of FIG. 6.

DETAILED DESCRIPTION

Figure 3:
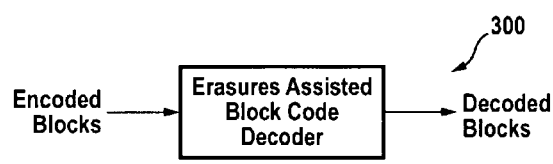
FIG. 3 is a high level, input-output diagram of an erasures assisted block code decoder.

Referring to FIG. 3, an embodiment of the invention comprises an erasures assisted block code decoder 300 configured to decode encoded blocks of data elements, for example bytes, into decoded blocks. It is assumed that bursty errors have been introduced into the incoming blocks, and the decoder 300 takes advantage of the "burstiness" of these errors to identify erasures, i.e., data elements within un-decodable blocks that are likely erroneous because they have been affected by the same error burst as a corrected data elements. Since an error has both a position and a value, the identification of an erasure identifies the position (specific data element) of a likely error within an un-decodable block, which is advantageously used by the decoder 306 in the decoding process.

Figure 1:
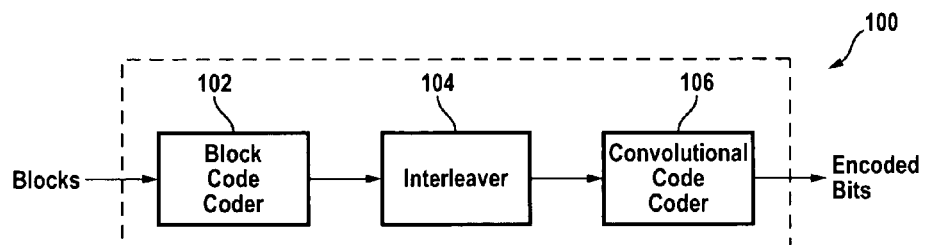
FIG. 1 is a block diagram of an example of a forward error correction code encoder that applies a concatenated code having an outer code and an inner code, wherein the outer code is a block code, for example, a Reed-Solomon code, and the inner code is a convolutional code.
Figure 2:
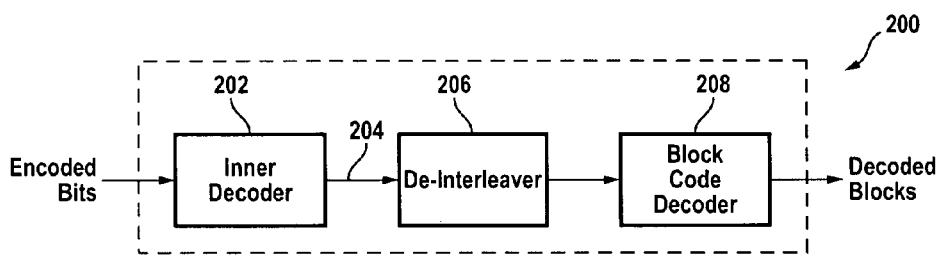
FIG. 2 is a block diagram of a decoder of coded data as produced by the encoder of FIG. 1.

In one configuration, the erasures assisted block code decoder 306 replaces the block code decoder 208 in the concatenated code decoder 200 of FIG. 2, and the bursty errors are introduced by inner decoder 202. In another configuration, the erasures assisted block code decoder 306 is a stand-alone decoder, and the busty errors are introduced by another mechanism.

Figure 4:
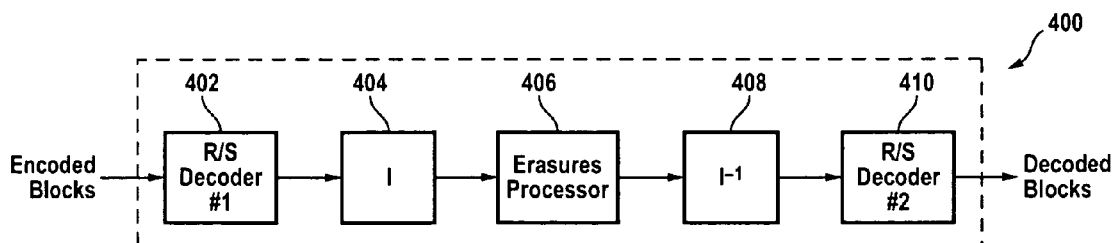
FIG. 4 is a block diagram of an embodiment of an erasures assisted block code decoder characterized by a first Reed-Solomon block code decoder, an erasures processor for identifying erasures, a second Reed-Solomon block code decoder, an interleaver interposed between the first Reed-Solomon block code decoder and the erasures processor, and a de-interleaver interposed between the erasures processor and the second Reed-Solomon decoder.

FIG. 4 illustrates an embodiment 400 of an erasures assisted block code decoder configured to decode blocks of data encoded by a (n, k) Reed-Solomon encoder, i.e., a encoder configured to append (n-k) bytes of parity information to each block of k bytes. In this embodiment, the erasures assisted block code decoder embodiment 400 comprises a first (n, k) Reed-Solomon decoder 402, a convolutional byte interleaver 404, an erasures processor 406, a de-interleaver 408, and a second (n, k) Reed-Solomon decoder 410. The first (n, k) Reed-Solomon decoder 402 is configured to decode blocks of data that have been encoded by a (n, k) Reed Solomon encoder and thereafter transmitted over the communications channel. The decoder 402 is configured to decode those of the encoded blocks where the number of errors is less than or equal to $\lfloor d_{min}/2 \rfloor$, where $d_{min}=(n-k+1)$, and identify those blocks that are un-decodable because the number of errors exceeds the error detection and correction capability of the decoder, i.e., exceeds $\lfloor d_{min}/2 \rfloor$.

For each decodable block, the decoder 402 is configured to mark each byte that was corrected by the decoder with a special code that can be represented for purposes of this disclosure as "Ced," which is shorthand for "corrected." The decoder 402 is configured to mark all other bytes in a decoded block with a code that can be represented for purposes of this disclosure as "C," which indicates the byte was already correct, and was not corrected by the decoder. The decoder 402 is further configured to mark each byte of an un-decodable block with a special code that for purposes of this disclosure can be represented as "F," indicating a decoding failure. The decodable and un-decodable blocks, together with the corresponding marks of the constituent bytes, are output from the decoder 402 and input to the interleaver 404.

The interleaver 404 is configured to permute the blocks (both decodable and un-decodable) output from the decoder 402, and thereby spread (disperse) the data elements in the un-decodable blocks identified by decoder 402. This spreading can be explained with reference to FIG. 5, which illustrates an example of the blocks of data elements output by the decoder 402. Numeral 500 identifies an un-decodable block of data elements, Y10, O11, and G12, etc., each of which is marked with an "F" as described previously. Numerals 502 and 504 identify successfully decoded blocks of data elements. Data elements that have potentially been effected by the same bursty error have the same letter prefix, e.g., the Y prefix designates one grouping of associated data elements, the O prefix designates a second such grouping of data elements, the G prefix designates a third such grouping of data elements, and the prefix B designates a fourth such grouping of data elements. Due to the action of the de-interleaver 206, these data elements have been separated into separate blocks.

The interleaver 404 rearranges this data as shown in FIG. 6 so that data elements from un-decodable blocks are separated into different blocks. Thus, as shown in FIG. 6, data elements Y10, O11 and G12, all from the same un-decodable block 500 in FIG. 5, are moved into different blocks through the permutations performed by interleaver 404.

FIG. 7 shows a detailed breakdown of the data elements O1, O2, O3, etc., in FIG. 6 in the case where each such data element is 17 bytes. As shown, it is assumed in FIG. 7 that the marking that is performed by decoder 402 occurs at the byte level, such that each byte is marked with either "C," "Ced," or "F."

Figure 8:
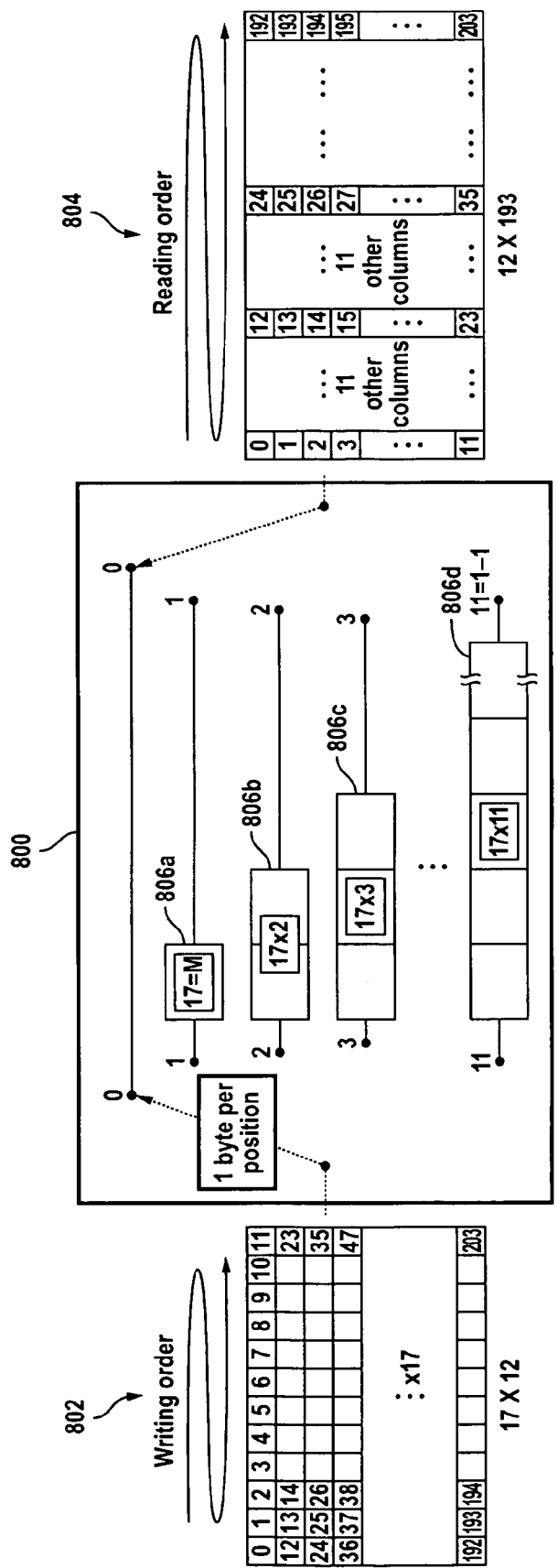
FIG. 8 is a diagram illustrating the structure and operation of an embodiment of the interleaver of FIG. 4.

In one embodiment, the interleaver 404 is a convolutional byte interleaver of the type shown in FIG. 8. In the particular example shown in FIG. 8, the interleaver 800 comprises a plurality of FIFO shift registers 806a, 806b, 806c, 806d of differing lengths, x1, x2, x3, etc., as shown, and is configured to receive an input block 802 of 17×12 bytes, and produce an output block 804 of 193×12 bytes as shown. Convolutional byte interleavers are known in the art, and need not be described in detail for an appreciation of the subject invention.

Erasures processor 406 next operates on this data to identify erasures, i.e., those data elements from the un-decodable blocks that are likely erroneous. In one configuration, the processor 406 identifies as erasures any data element from an un-decodable block that is adjacent to a corrected data element from a decoded blocks, indicating these data elements were likely affected by the same bursty error. In FIG. 7, for example, where the data elements are bytes, the erasures processor 406 identifies bytes 702, 704, 706 and 708 as erasures because each is vertically adjacent to at least one corrected byte from a decoded block.

In one embodiment, the bytes in a block are numbered as shown in FIG. 7. For each byte marked "F" (indicating the byte originated from an un-decodable block), the erasures processor 406 is configured to form an "observation" from the previous byte, the current byte (the byte marked "F"), and the next byte. Denoting the "observation by $(X_{n-1}-F-X_{n+1})$, the erasures processor 406 identifies the byte marked "F" as an erasure if the observation containing the byte matches any of the following three patterns: (Ced–F–C), (C–F–Ced), or (Ced–F–Ced).

Figure 9:
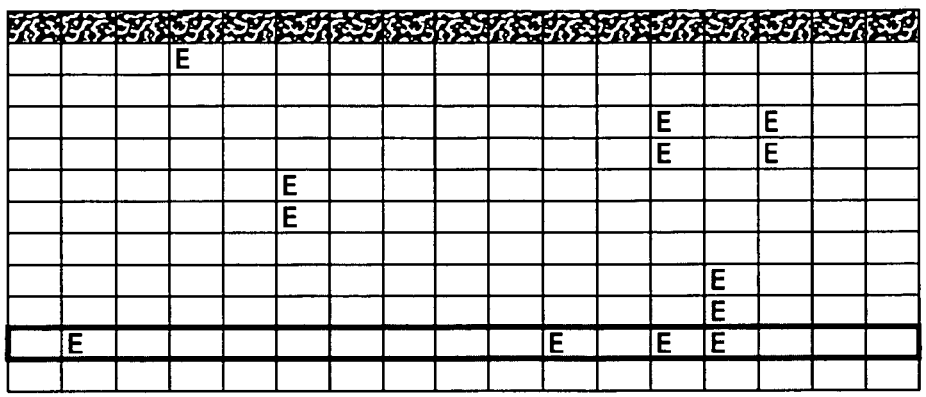
FIG. 9 illustrates the data of FIG. 7 after erasures have been identified, and the data has been passed through the de-interleaver of FIG. 4.

Once the erasures have been identified, the data is input to the de-interleaver 408, which is configured to de-interleave the data and reverse the permutations introduced by the interleaver 404. The effect is to return the data to the form shown in FIG. 5, except that erasures are now identified, as shown in FIG. 9.

The data is then input to the (n, k) Reed-Solomon decoder 410, which may physically be the same or a distinct decoder from decoder 402. Armed with the erasures that have been identified, the decoder 410 is in a better position than the decoder 402 to decode the un-decodable blocks, such as block 500 in FIG. 5. That is because an error has a position and a value, and an erasure is a likely error whose position is known, and whose value only remains to be determined. Therefore, a (n, k) Reed Solomon decoder is able to correct twice as many erasures as errors. In other words, if |E| denotes the number of erasures and |X| the number of errors in a block, then the following relationship must hold: $|E|+2|X|<d_{min}$ where $d_{min}=(n+k-1)$. Therefore, by converting some of the errors into erasures, the intended result of the erasures identification process, a previously un-decodable block may now become decodable. Consider, for example, a Reed-Solomon decoder where $d_{min}$ is 17. Assume a particular block is un-decodable by this decoder because the number of errors in the block is equal to nine. If one of these errors is now identified as an erasure, the block now becomes decodable. That is because |E|+2|X|=17, which is less than $d_{min}$ as required.

It should be appreciated that, in the embodiment of the erasures assisted block decoder illustrated in FIG. 4, the interleaver 404 and de-interleaver 408 are optional as it is possible to identify erasures without such elements. In particular, referring to FIG. 5, and applying a decision rule whereby un-decodable byte (marked "F") is identified as an erasure if it matches (Ced–F–X) or (X–F–Ced), where "X" indicates a wildcard byte that matches anything, bytes in Y10 may be identified as an erasure or not based solely on Y9 and Y11. Similarly, bytes in O11 may be identified as an erasure or not based solely on consideration of O10 and O12.

Additionally, it should be appreciated that embodiments are possible where the decoders 402 and 410 are block decoders other than Reed-Solomon decoders.

It should further be appreciated that erasures processor 406 may be embodied in a variety of forms, such as a microprocessor or microcontroller configured to access and execute software instructions stored in a memory, or a finite state machine configured to change state in response to one or more inputs applied to one or more state transition rules. Thus, this processor may be embodied as hardware, software, or a combination of hardware and software.

The erasures processor 406 may implement other decision rules than those previously discussed. For example, consider the case where the number of erasures identified in a block exceeds $d_{min}$. In that case, according to a first method of identification, $(d_{min}-1)$ erasures could be randomly identified, and decoding attempted as before. Only after a predetermined number of attempts, would a decoding failure be declared. For example, in the case where $d_{min}$ is 17, and more than 16 erasures have been identified, 16 such erasures could be randomly selected, and decoding then attempted. A decoding failure would be declared if a predetermined number, e.g., one, of such attempts fails.

An alternative method, assuming the number of erasures exceeds $d_{min}$, selects K out of |E| erasures, where $K<d_{min}$, and attempts decoding with all |E|!/(K!(|E|-K)!) combinations. In this example, failure would be declared only if none of the combinations were decodable.

Also, the erasures processor 406 may follow a variety of possible decision rules. For example, in addition to or in lieu of the previously discussed decision rule, the processor 406 may follow a decision rule according to which all the un-decodable bytes (marked "F") that match the following pattern are identified as erasures: (Ced–F–F– . . . –F–X).

In another alternative configuration, the decoded bytes from Reed-Solomon decoder 402 are divided into three categories, Ced_right, Ced_left, and Ced-mid. A Ced_right byte is a Ced byte that has been corrected in the last 2 bits only: (c, c, c, c, c, ced, ced). A Ced_left byte is a Ced byte that has been corrected in the first 2 bits only: (ced, ced, c, c, c, c, c, c). A Ced_mid byte is a Ced byte that is neither Ced_right nor Ced_left. In this configuration, the processor 406 follows a decision rule according to which any un-decodable byte (marked "F") that matches any of the following patterns is identified as an erasure: ((Ced or Ced_right)–F–C), (C–F–(Ced or Ced_left)), or ((Ced or Ced_right)–F–(Ced or Ced_left)).

In addition to or in lieu of this decision rule, the processor 406 could follow a decision rule according to which all un-decodable bytes (marked "F") that match the following pattern are identified as erasures: ((Ced or Ced_right)–F–F– . . . –F–X).

In addition to or in lieu of the foregoing decision rules, the processor 406 could follow a decision rule according to which any un-decodable byte (marked "F") that matches either of the following two patterns is identified as an erasure: ((Ced or Ced_right)–F–X), ((X–F–(Ced or Ced_left)).

Figure 10:
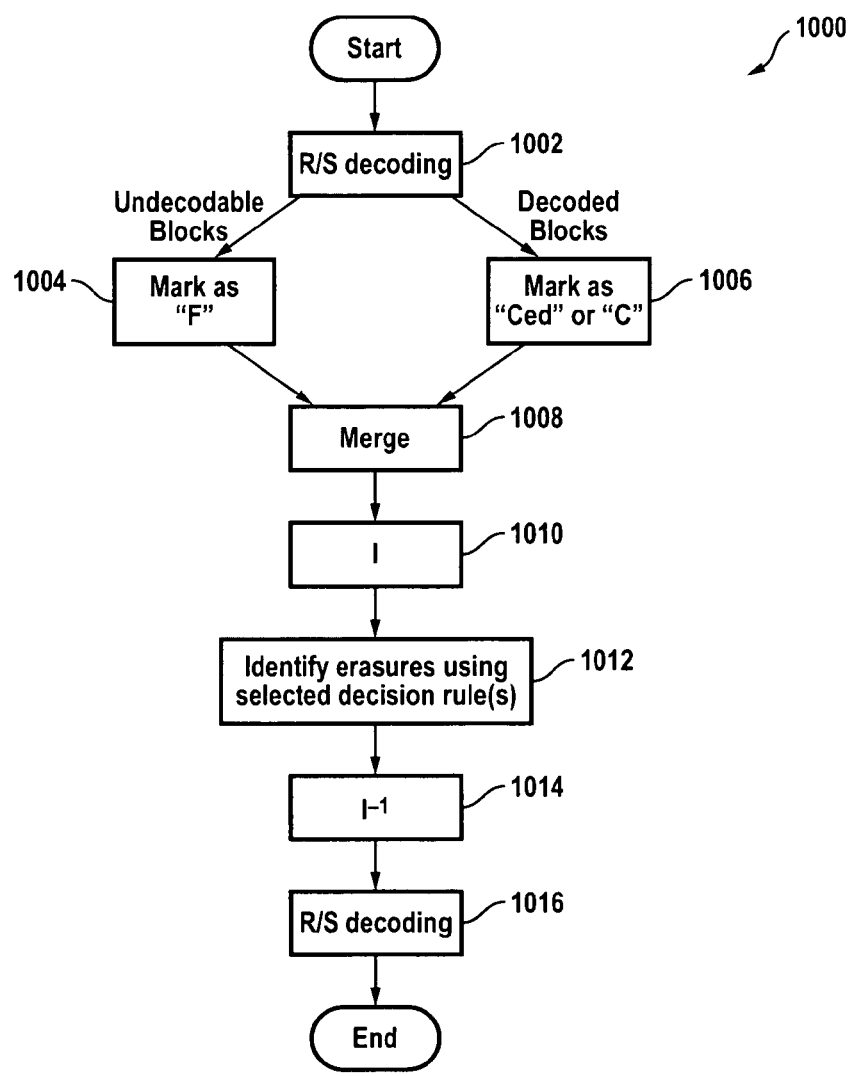
FIG. 10 is a flowchart of an embodiment of a method of operating an erasures assisted block code decoder.

FIG. 10 is a flowchart 1000 of an embodiment of a method of operating an erasures assisted block decoder, such as but not limited to the erasures assisted block decoder of FIG. 4.

In step 1002, incoming blocks of data elements are decoded using a Reed-Solomon decoder and un-decodable blocks are also identified.

In step 1004, which follows step 1002, the bytes in the un-decodable blocks are each marked with an "F," indicating a decoding failure.

In step 1006, which may occur concurrently with step 1004, each byte in a decoded block is either marked "C," indicating a byte that was already correct prior to decoding, or "Ced," indicating a byte that was corrected during decoding.

In step 1008, which follows steps 1004 and 1006, the marked blocks from steps 1004 and 1006 are merged, and, in step 1010, the resulting data is interleaved, thereby separating the bytes marked as decoding failures.

Step 1012 follows step 1010. In step 1012, one or more of the previously described decision rules are followed to identify as erasures selected ones of the bytes marked as decoding failures.

Step 1014 follows step 1012. In step 1014, the blocks of data are de-interleaved, reversing the permutations introduced by the interleaving step 1010.

Step 1016 follows step 1014. In step 1016, the data from step 1014 is decoded using the same or a different Reed-Solomon decoder as that used in step 1002. In this step, the erasures that have been identified are utilized to decode one or more of the blocks that were deemed un-decodable in step 1002.

Other method embodiments are possible, including embodiments where steps 1002 and 1016 are performed by the same or different block decoders, where the decoder are block decoders other than Reed-Solomon block decoders, where the data elements are other than bytes, and whether the interleaving step 1010 and de-interleaving step 1014 are avoided.

While various embodiments of the invention have been described, it will be apparent to those of ordinary skill in the art that many more embodiments and implementations are possible that are within the scope of this invention. Accordingly, the invention is not to be restricted except in light of the attached claims and their equivalents.

What is claimed is:

1. A concatenated code decoder comprising:
   an inner decoder for decoding encoded bits and having a tendency to introduce bursty errors;
   a de-interleaver for de-interleaving the decoded bits output from the inner decoder to produce blocks of data; and
   an erasures assisted block code decoder for decoding the blocks of data output by the de-interleaver, the erasures assisted block code decoder comprising:
   a first block decoder for decoding blocks of data elements, and for identifying blocks that are un-decodable by the first block decoder;
   an interleaver for interleaving the blocks output by the first block decoder, thereby spreading any data elements in un-decodable blocks;
   an erasures processor for identifying, as erasures, data elements in the un-decodable blocks that are likely erroneous, the identification occurring by utilizing data in the decoded blocks that was corrected during decoding by said first block decoder;
   a de-interleaver for de-interleaving blocks of data output by the erasures processor; and
   a second block decoder for decoding one or more of the un-decodable blocks of data by utilizing in the decoding one or more of the erasures identified by the erasures processor.

2. The concatenated code decoder of claim 1 wherein the first and second block decoders are the same physical decoder utilized at different times.

3. The concatenated code decoder of claim 1 wherein the first and second block decoders are physically distinct decoders.

4. A concatenated code decoder comprising:
   a Viterbi decoder for decoding convolutionally encoded bits and having a tendency to introduce bursty errors;
   a de-interleaver for de-interleaving the decoded bits output from the Viterbi decoder to produce blocks of data; and
   an erasures assisted block code decoder for decoding the blocks of data output by the de-interleaver, the erasures assisted block code decoder comprising:
   a first Reed-Solomon block decoder for decoding blocks of data elements, and for identifying blocks that are un-decodable by the first block decoder;
   an interleaver for interleaving the decoded blocks output by the first block decoder, thereby spreading data elements in any un-decodable blocks;
   an erasures processor for identifying, as erasures, data elements in the un-decodable blocks by utilizing data in the decoded blocks that was corrected during decoding by said first block decoder;
   a de-interleaver for de-interleaving blocks of data output by the erasures processor; and
   a second Reed-Solomon block decoder for decoding one or more of the un-decodable blocks of data by utilizing in the decoding one or more of the erasures identified by the erasures processor.

5. The concatenated code decoder of claim 4 wherein the first and second Reed-Solomon block decoders are the same physical decoder utilized at different times.

6. The concatenated code decoder of claim 4 wherein the first and second Reed-Solomon block decoders are physically distinct decoders.

* * * * *